United States Patent
Jeong et al.

(10) Patent No.: US 7,262,114 B2
(45) Date of Patent: Aug. 28, 2007

(54) DIE ATTACHING METHOD OF SEMICONDUCTOR CHIP USING WARPAGE PREVENTION MATERIAL

(75) Inventors: Ki-kwon Jeong, Cheonan-si (KR); Hyeon Hwang, Cheonan-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 282 days.

(21) Appl. No.: 11/045,078

(22) Filed: Jan. 31, 2005

(65) Prior Publication Data

US 2006/0019463 A1    Jan. 26, 2006

(30) Foreign Application Priority Data

Jul. 26, 2004    (KR) .................... 10-2004-0058363

(51) Int. Cl.
    *H01L 21/46* (2006.01)
(52) U.S. Cl. .............................. 438/460; 257/E21.237
(58) Field of Classification Search ........ 257/E21.237; 438/460
    See application file for complete search history.

(56) References Cited

U.S. PATENT DOCUMENTS 6,436,795 B2 * 8/2002 Noguchi et al. ............ 438/460

2004/0097054 A1 * 5/2004 Abe ........................... 438/460

FOREIGN PATENT DOCUMENTS

JP    2001-135598    5/2001
KR    2003-0095351   12/2003

* cited by examiner

*Primary Examiner*—Asok Kumar Sarkar
(74) *Attorney, Agent, or Firm*—Volentine & Whitt, PLLC

(57) ABSTRACT

A die attaching method of a semiconductor chip simplifies the process of fabricating a package from the chip while preventing the chip form being damaged even when the chip is very thin. Warpage prevention material is adhered to a top surface of a wafer having a plurality of chips formed thereon, and then the wafer is cut to separate the chips from one another. Each semiconductor chip is then placed on and attached to a die pad of a base frame, while the warpage prevention material is detached from the semiconductor chip. Thus, the warpage prevention material is removed without requiring a process that is extraneous to the die attaching process.

14 Claims, 6 Drawing Sheets

DIE ATTACHING METHOD OF SEMICONDUCTOR CHIP USING WARPAGE PREVENTION MATERIAL

BACKGROUND OF THE INVENTION

1. Field of the Invention

The present invention relates to a method of fabricating a semiconductor package. More particularly, the present invention relates to a die attaching method for attaching a semiconductor chip onto a die pad of a base frame.

2. Description of the Related Art

Recently, electronic appliances have become smaller and thinner. Accordingly, semiconductor packages employed by today's electronic appliances must be suitably small and thin. Thus, new methods of manufacturing small and thin semiconductor packages are continuously being developed. For example, a technique of grinding the back side of a semiconductor chip has been developed for producing a thin semiconductor package. In this case, the semiconductor chip can have a thickness of 100 μm or less.

A semiconductor package is manufactured by attaching a semiconductor chip to a base frame such as a lead frame or a printed circuit board, electrically connecting the semiconductor chip and the base frame with bonding wires or (solder) bumps, and encapsulating the semiconductor chip in a sealing resin. However, in the case in which the back side of the semiconductor chip is ground, because of its thinness, the semiconductor chip may warp or crack during its handling.

In order to prevent such a problem, the semiconductor chips are fabricated from a wafer, a protective tape is attached to a front surface of the wafer, and the wafer is then sliced to separate the wafer into individual semiconductor chips. The protective tape also prevents the front surface of the wafer from being contaminated by silicon particles that are inevitably generated during the slicing process.

FIG. 1 is a flow chart of that portion of a method of assembling a semiconductor package wherein the semiconductor chip is attached to a base frame (hereinafter referred to as a "die-attaching method").

Referring to FIG. 1, first, protective tape is attached to the front surface of a wafer and the bottom surface of the wafer is ground (S10). Subsequently, the wafer is attached to a film type of die attaching tape (S20). The wafer is then cut by a blade to separate the semiconductor chips from one another (S30). The individual (unit) chips are then separated from the film type of die attaching tape, and are each attached on a die pad of the base frame; that is, the die attaching process is performed (S40). After the die attaching process is performed, the protective tape is irradiated with ultraviolet rays to weaken the adhesive force, and an adhesive strip is attached to the protective tape and then pulled to remove the protective tape (S50).

However, according to the conventional art described above, the protective tape must be removed (representing an additional process in the manufacturing of the package), and equipment for removing the protective tape is thus required. Accordingly, this additional process impacts the productivity of the prior art processes for fabricating semiconductor packages.

SUMMARY OF THE INVENTION

An object of the present invention is to provide a die attaching method for a semiconductor chip that can be carried out relatively quickly and, at the same time, prevents the chip from being contaminated.

Another object of the present invention is to provide a die attaching method for a semiconductor chip that can be carried out relatively quickly and, at the same time, is unlikely to damage the chip even when the chip is very thin.

According to an aspect of the present invention, there is provided a die attaching method of a semiconductor chip wherein warpage prevention material is adhered to a front (top) surface of a wafer bearing a plurality of semiconductor chips. The warpage prevention material preferably comprises a protective tape or a glass. A film type of die attaching tape is adhered to the bottom surface of the wafer. Next, the wafer is cut to separate the semiconductor chips from one another. The resultant chips are conveyed to a die attaching apparatus. There, each semiconductor chip is picked up using a collet of the die attaching apparatus. Then, the semiconductor chip is placed onto a die pad of a base frame while the warpage prevention material is detached from the semiconductor chip in the die attaching apparatus. Finally, the collet of the die attaching apparatus removes the warpage prevention material and discards it.

The warpage prevention material my be detached by irradiating it with ultraviolet rays to weaken the adhesive by which it is secured to the chip. In this case, a unit for emitting the ultraviolet rays may be incorporated in the collet of the die attaching apparatus, and the collet may have holes through which the ultraviolet rays are emitted onto the warpage prevention material.

Alternatively, the warpage prevention material may be detached by heating it to weaken the adhesive force by which it is secured to the chip. In this case, a heater for applying the heat to the semiconductor chip may be incorporated in a heater block on which the base frame is placed.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

The present invention will now be described more fully with reference to the accompanying drawings.

Figure 1:
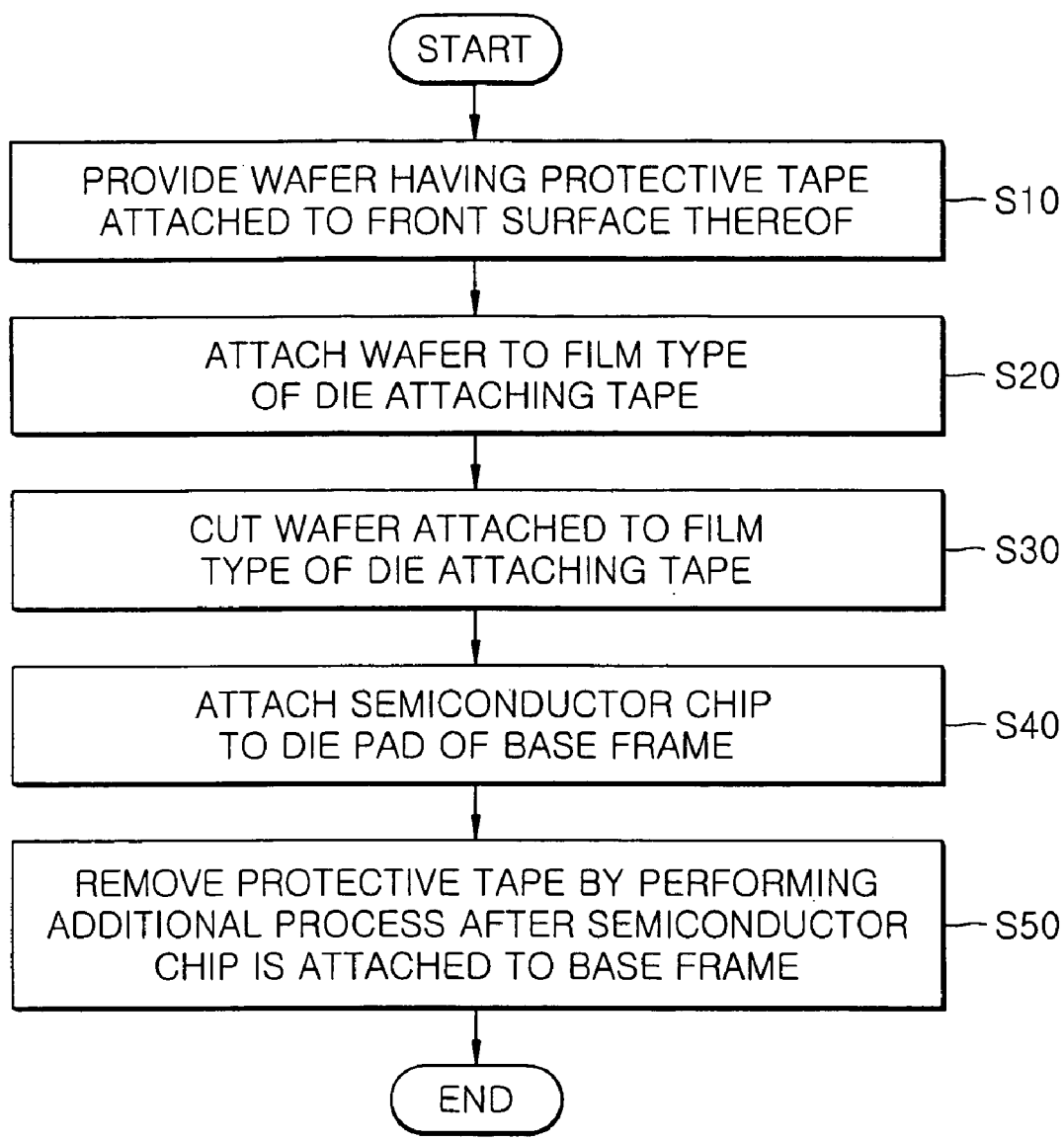
FIG. 1 is a flow chart of a conventional die attaching method wherein a semiconductor chip is attached to a base frame.
Figure 2:
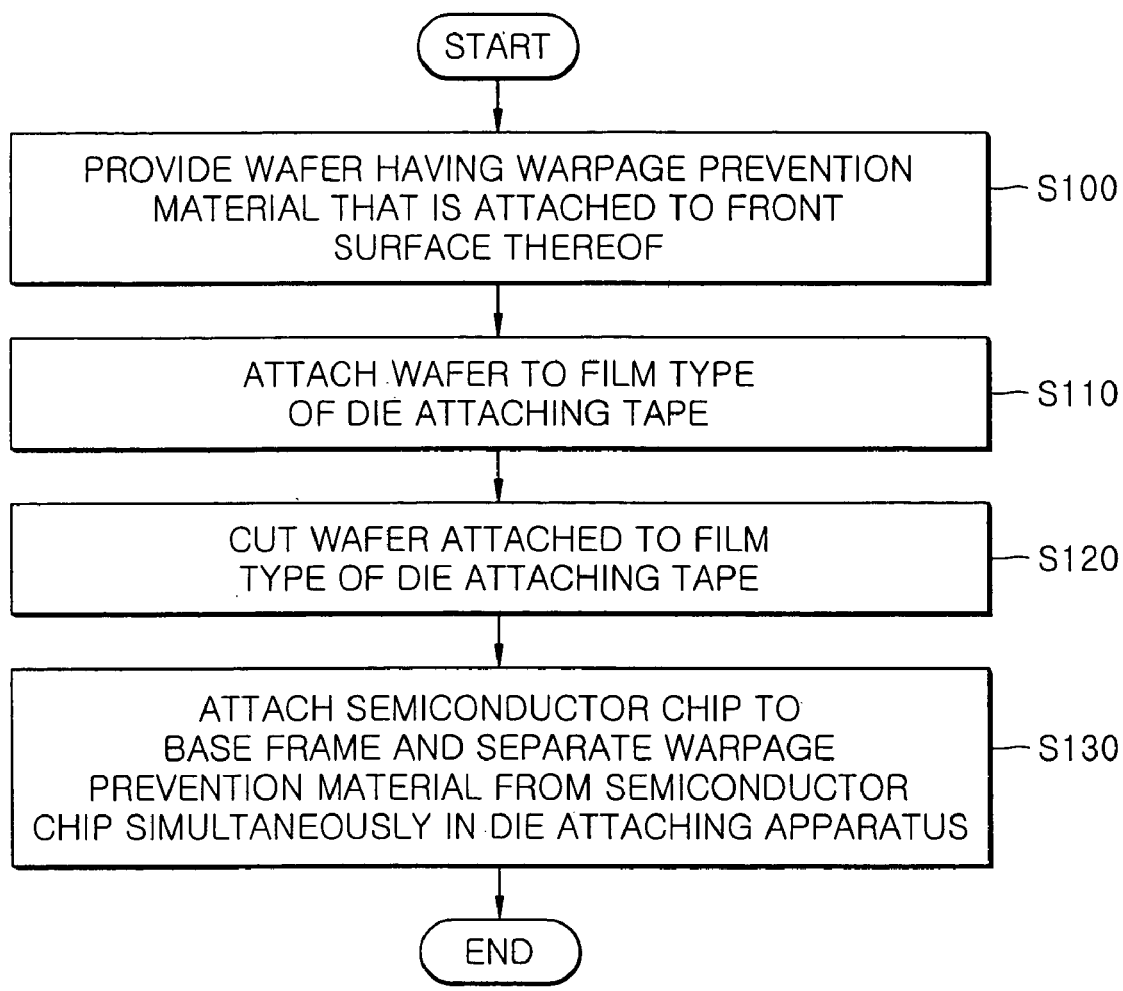
FIG. 2 is a flow chart of a die attaching method according to the present invention.

Referring first to FIG. 2, warpage prevention material is attached to a front surface of a wafer (S100). A plurality of semiconductor chips have been formed on the wafer. The warpage prevention material can be a transparent material such as glass through which ultraviolet rays can pass, or a transparent film of protective tape through which ultraviolet rays can pass. In addition, the warpage prevention material preferably comprises an adhesive, the force of which can be removed by being irradiated with ultraviolet rays or by being heated.

The wafer, to which the warpage prevention material is attached, is attached to a film type of die attaching tape (S110). Next, the wafer to which the film type of die attaching tape is attached is cut along lines that divide the chips from one another (S120). The chips may be very thin, e.g., may have a thickness of 30~100 µm. The warpage prevention material prevents the front surface of the wafer from being contaminated by silicon particles, and the semiconductor chips from being damaged or warped when the semiconductor chips are handled.

The wafer, having been cut on the film type of die attaching tape, is conveyed to a die attaching apparatus. Then, the semiconductor chips are separated using a needle and, at the same time, the warpage prevention material is removed from each chip while the chip is attached to a die pad of a base frame, for example, a lead frame or a printed circuit board (S130). In other words, the warpage prevention material is removed without performing an additional process. The removing of the warpage prevention material while the chips are attached to the die pads will be described in more detail with reference to FIGS. 3 through 10.

Figure 3:
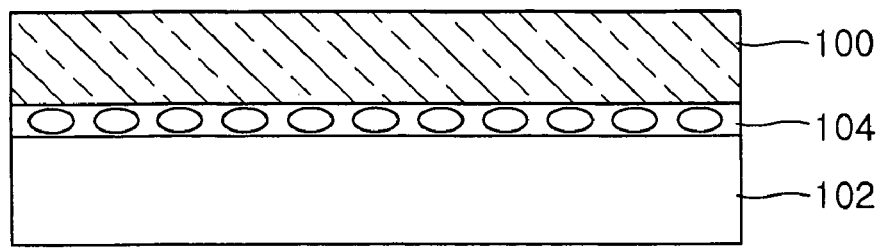
FIGS. 3 through 9 are cross-sectional views of a wafer illustrating the die attaching method according to the present invention.

Referring to FIG. 3, the warpage prevention material 102 is attached to the wafer 100 using attaching means 104. The warpage prevention material 102 comprises a glass or a transparent protective tape through which ultraviolet rays can pass. In addition, the attaching means 104 is preferably an adhesive, the adhesive force of which is removed by ultraviolet rays or heat.

Figure 4:
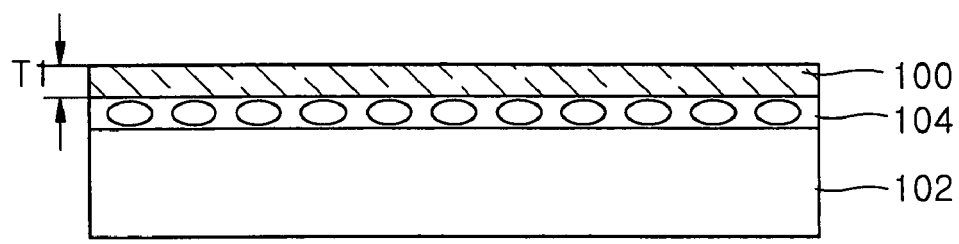
Figure 5:
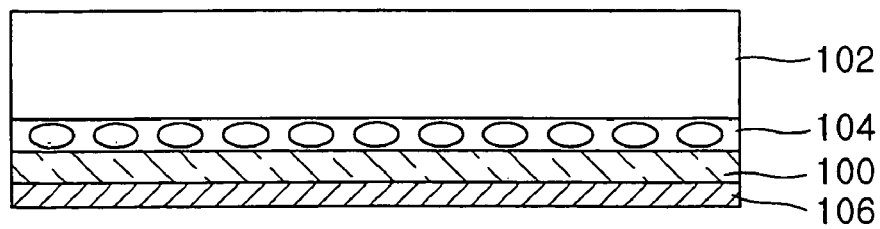

Referring to FIGS. 4 and 5, while the warpage prevention material remains attached to the wafer, the bottom surface of the wafer 100 is ground until the thickness T1 of the wafer 100 is 30~100 µm. Then, the wafer 100 is turned over and attached to a film type of die attaching tape 106. The film type of die attaching tape 106 is used to support the wafer during a subsequent cutting process. Also, the adhesive component at the surface of the film type of die attaching tape 106 remains on the bottom surface of the semiconductor chip 100 when the unit semiconductor chip is separated from the die attaching tape. This remaining adhesive functions to secure the semiconductor chip to a die pad.

Figure 6:
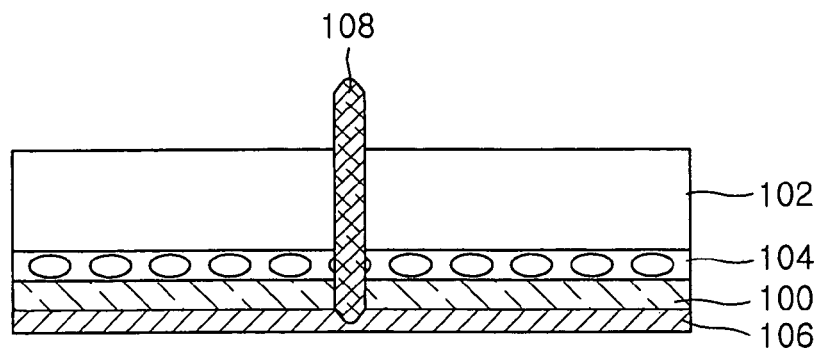
Figure 7:
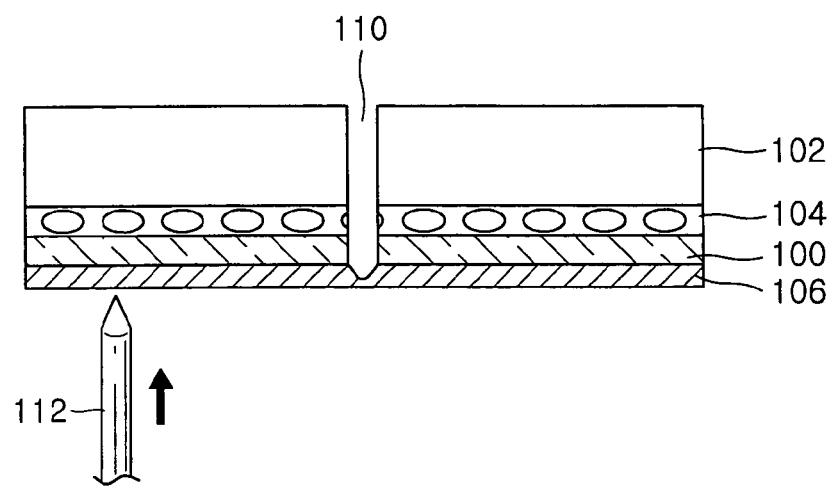

Referring to FIGS. 6 and 7, the wafer 100 is conveyed to a cutting apparatus, where the wafer 100 is cut using a blade to separate the semiconductor chips 101 from one another. At this time, the warpage prevention material 102 prevents the front surface of the semiconductor chip 101 from being contaminated by silicon particles that are inevitably produced during the cutting process. Next, the wafer is conveyed to the die attaching apparatus. In the die attaching apparatus, a needle 112 is raised in the direction of the arrow shown in FIG. 7 into contact with the film type of die attaching tape 106, to remove the tape 106 and thereby separate the film type die attaching tape 106 from the semiconductor chips 101.

Figure 8:
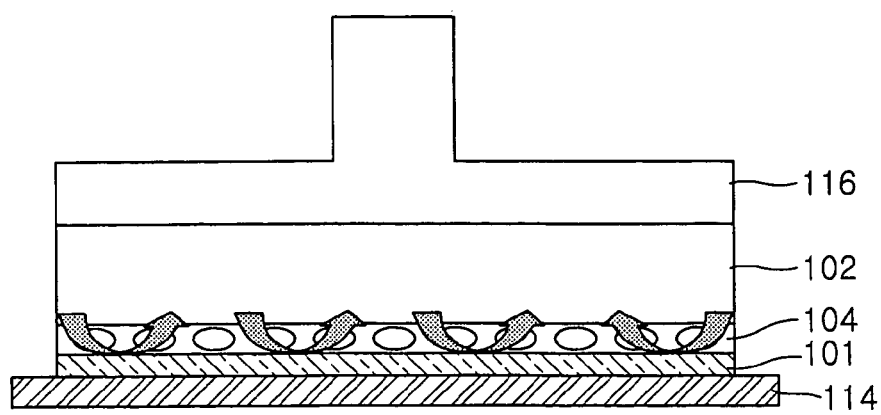

Referring to FIG. 8, a collet 116 picks up each semiconductor chip 101 using a vacuum, and attaches the semiconductor chip 101 to a die pad 114 of a base frame, for example, a lead frame or a printed circuit board. As mentioned above, the attaching of the semiconductor chip 101 to the die pad 114 is facilitated by the adhesive component of the film type of die attaching tape.

Figure 9:
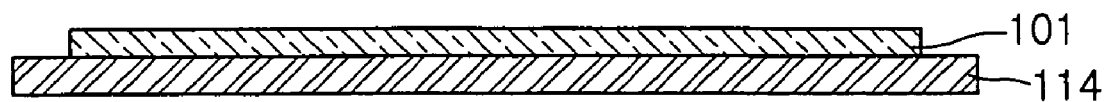

At the same time, the force by which the attaching means 104 attaches the semiconductor chip 10 to the warpage prevention material 102 is removed. Specifically, ultraviolet rays or heat is applied to the attaching means 104 to relieve the adhesive force. Then, the warpage prevention material is removed from the semiconductor chip 101 by the collet 116. As a result, a semiconductor chip 101 having a thickness of only 30~100 µm is attached to the die pad 114 of a base frame, as shown in FIG. 9.

A method of irradiating of the attaching means with ultraviolet rays will be described with reference to FIG. 10, whereas a method of applying heat to the attaching means 104 will be described with reference to FIG. 11.

Figure 10:
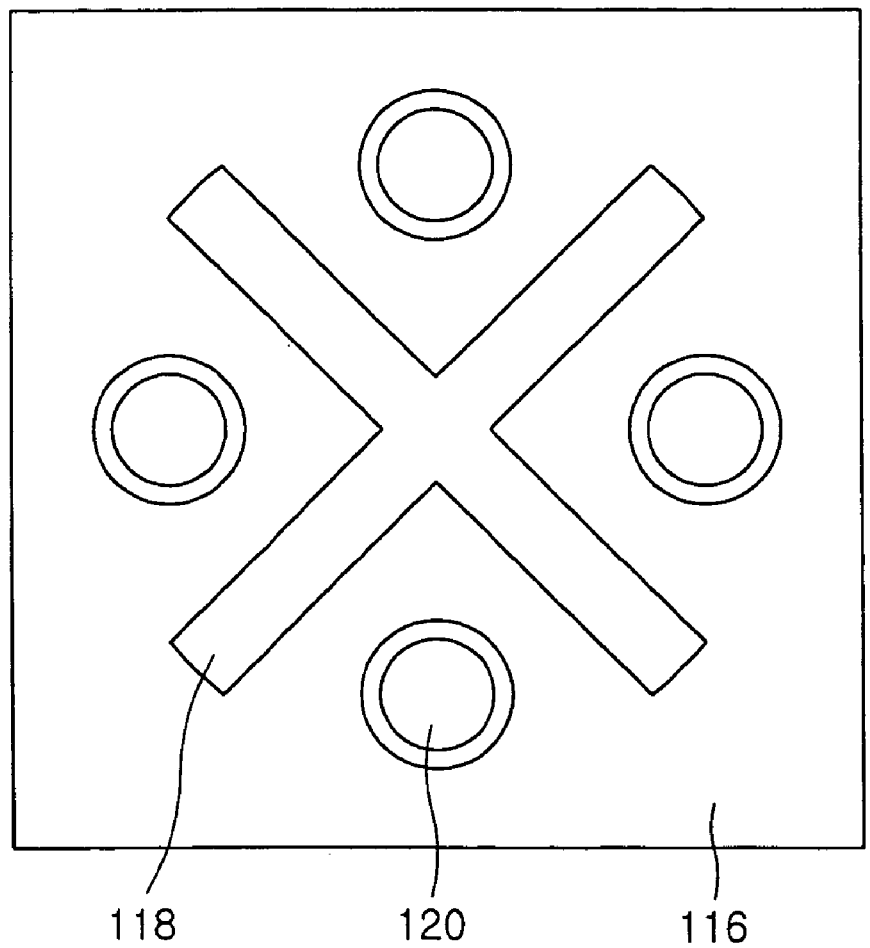
FIG. 10 is a bottom view of a collet of a die attaching apparatus for separating the warpage prevention material from the wafer using ultraviolet rays.

Referring to FIG. 10, the attaching means 104 is irradiated with ultraviolet ray using an appropriate device in the die attaching apparatus. Preferably, the collet 116 comprises such a device. To this end, the collet 116 has a plurality of UV irradiation holes 120 that are open at the bottom surface of the collet 116, and an ultraviolet light source that emits ultraviolet rays through the holes 120. The ultraviolet rays are emitted through the UV irradiation holes 120 at an intensity of 1500~2500 µW/cm$^2$, for example, to sufficiently weaken the adhesive force of the attaching means 104. Accordingly, the warpage prevention material 102 is released from the semiconductor chip 101 and held to the bottom surface of the collet 116 as the semiconductor chip 101 is attached to the die pad of the base frame. Then, the collet 116 discards the warpage prevention material in a dedicated area of the die attaching apparatus.

Figure 11:
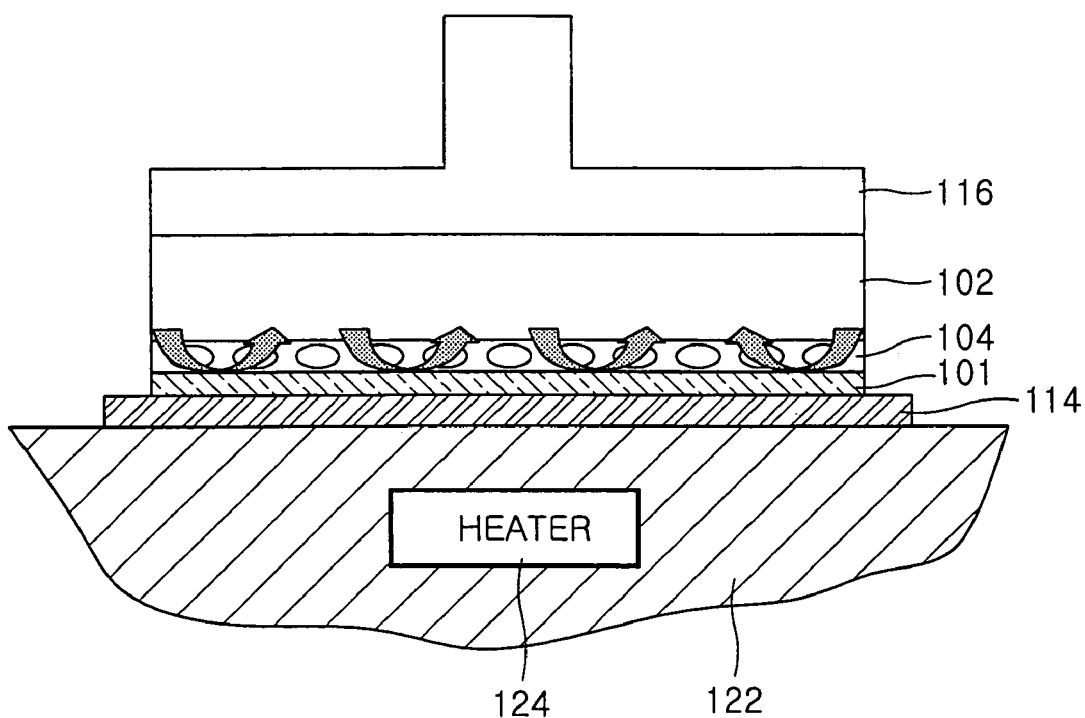
FIG. 11 is a cross-sectional view of a die attaching apparatus for separating the warpage prevention material from the wafer using heat.

Referring to FIG. 11, the die attaching apparatus comprises a heater block 122 onto which the base frame is placed, and a heater 124 disposed in the heater block 122. The heater 124 is operative to heat the attaching means 104 to a temperature of 100° C.~200° C., i.e., a temperature that sufficiently weakens the adhesive force of the attaching means. In this case as well, as a result, the warpage prevention material is grasped by the collet 116, and the semiconductor chip 101 is attached to the die pad 114 of the base frame. Then, the collet 116 is moved to a dedicated area in the die attaching apparatus when the collet discards the warpage prevention material.

According to the present invention, as described above, the warpage prevention material allows the wafer to be handled easily during the back side grinding process in which the wafer is ground so as to have a thickness of as little as 30~100 µm. in addition, the same warpage prevention material prevents the relatively thin wafer from warping or otherwise being damaged during the cutting process and the die attaching process. Still further, the warpage prevention material protects the wafer from being contaminated during the back side grinding process, the cutting process, and the die attaching process.

Moreover, the warpage prevention material can be removed during the die attaching operation. Accordingly, the method of the present invention saves the costs associated with a dedicated apparatus for removing the material, and the process can be carried out with a high degree of productivity.

Finally, although the present invention has been particularly shown and described with reference to the preferred embodiments thereof, it will be understood by those of ordinary skill in the art that various changes in form and details may be made thereto without departing from the true spirit and scope of the present invention as defined by the following claims.

What is claimed is:

1. A die attaching method for use in the fabrication of a semiconductor package, the method comprising:

attaching warpage prevention material to the top surface of a wafer over a plurality of semiconductor chips;

attaching a film type of die attaching tape to a bottom surface of the wafer;

subsequently cutting the wafer along lines that divide the semiconductor chips from one another;

conveying the resultant semiconductor chips separated on the film type of die attaching tape to a die attaching apparatus that is operative to secure a semiconductor chip to a die pad of a base frame;

picking the semiconductor chips up using a collet of the die attaching apparatus, and attaching each of the semiconductor chips to a die pad of a base frame while detaching the warpage prevention material from the semiconductor chip in the die attaching apparatus; and grasping the warpage prevention material on each semiconductor chip with the collet of the die attaching apparatus, and removing the warpage prevention material from the semiconductor chip after the chip has been attached to the die pad.

2. The method of claim 1, wherein said attaching of the warpage prevention material to the top surface of the wafer comprises securing the warpage prevention material to the wafer using adhesive, and said detaching of the warpage prevention material from the semiconductor chips in the die attaching apparatus comprises irradiating the adhesive with ultraviolet rays.

3. The method of claim 2, wherein said irradiating the adhesive with ultraviolet rays comprises irradiating the adhesive with ultraviolet rays having an intensity of 1500~2500 mW/cm$^2$.

4. The method of claim 2, wherein said attaching of each of the semiconductor chips to a die pad of a base frame while detaching the warpage prevention material from the semiconductor chip in the die attaching apparatus comprises:
  placing the semiconductor chip against the die pad of the base frame with the collet, and
  simultaneously irradiating the warpage prevention material by emitting ultraviolet rays through the collet.

5. The method of claim 1, wherein said attaching of the warpage prevention material to the top surface of the wafer comprises securing the warpage prevention material to the wafer using adhesive, and said detaching of the warpage prevention material from the semiconductor chips in the die attaching apparatus comprises heating the warpage prevention material.

6. The method of claim 5, wherein said heating the warpage prevention material comprises heating the warpage prevention material to a temperature of 100~200° C.

7. The method of claim 5, wherein said attaching of each of the semiconductor chips to a die pad of a base frame while detaching the warpage prevention material from the semiconductor chip in the die attaching apparatus comprises:
  placing the base frame on a heater block,
  placing the semiconductor chip against the die pad of the base frame with the collet, and
  while the semiconductor chip is being placed against the die pad of the base frame with the collet, heating the semiconductor chip through the heater block.

8. The method of claim 1, wherein said attaching of the warpage prevention material to the top surface of a wafer comprises attaching a layer of glass to the top surface of a wafer.

9. The method of claim 1, wherein said attaching of the warpage prevention material to the top surface of a wafer comprises attaching a protective tape to the top surface of a wafer.

10. The method of claim 1, further comprising grinding the wafer at the bottom surface thereof before the film type of die attaching tape is attached thereto, to thereby reduce the thickness of the wafer.

11. The method of claim 10, wherein the grinding is carried out until the thickness of the wafer is 30~100 μm.

12. The method of claim 1, wherein the film-type of die attaching tape comprises an adhesive, and said attaching of each of the semiconductor chips to a die pad of a base frame comprises removing the film type of die attaching tape from the wafer in such a way as to leave adhesive from the tape on the bottom surface of the wafer, and pressing the adhesive left on the bottom surface against the die pad.

13. The method of claim 1, wherein the base frame is a lead frame.

14. The method of claim 1, wherein the base frame is a printed circuit board.

* * * * *